(12) United States Patent
Anderson et al.

(10) Patent No.: US 10,177,064 B2
(45) Date of Patent: *Jan. 8, 2019

(54) AIR CAVITY PACKAGE

(71) Applicant: Qorvo US, Inc., Greensboro, NC (US)

(72) Inventors: Kevin J. Anderson, Plano, TX (US);
Anthony Chiu, Richardson, TX (US);
Tarak A. Railkar, Plano, TX (US)

(73) Assignee: Qorvo US, Inc., Greensboro, NC (US)

(*) Notice: Subject to any disclaimer, the term of this patent is extended or adjusted under 35 U.S.C. 154(b) by 24 days.

This patent is subject to a terminal disclaimer.

(21) Appl. No.: 15/364,752

(22) Filed: Nov. 30, 2016

(65) Prior Publication Data
US 2018/0061730 A1    Mar. 1, 2018

Related U.S. Application Data

(60) Provisional application No. 62/379,922, filed on Aug. 26, 2016.

(51) Int. Cl.
*H01L 23/367* (2006.01)
*H01L 23/66* (2006.01)
(Continued)

(52) U.S. Cl.
CPC ........ *H01L 23/367* (2013.01); *H01L 23/3731* (2013.01); *H01L 23/3736* (2013.01);
(Continued)

(58) Field of Classification Search
CPC ... H01L 23/367; H01L 24/32; H01L 23/3731; H01L 23/3736; H01L 24/73;
(Continued)

(56) References Cited

U.S. PATENT DOCUMENTS 9,935,026 B2 * 4/2018 Anderson ............. H01L 25/105
9,974,158 B2 * 5/2018 Railkar ................ H05K 1/0206
(Continued)

OTHER PUBLICATIONS

Author Unknown, "Package on Package (PoP | PSfvBGA | PSfcCSP | TMV® PoP)" Amkor Technology, date accessed: Aug. 17, 2016, 5 pages, http://www.amkor.com/go/Package-on-Package.
(Continued)

*Primary Examiner* — Matthew Reames
*Assistant Examiner* — Scott Bauman
(74) *Attorney, Agent, or Firm* — Withrow & Terranova, P.L.L.C.

(57) ABSTRACT

The present disclosure relates to an air-cavity package, which includes a substrate, a base, and a semiconductor die. The substrate includes a substrate body, thermal vias extending through the substrate body, and a metal trace on a bottom side of the substrate body and separate from the thermal vias. The base includes a base body, a perimeter wall extending about a perimeter of the base body, and a signal via structure. Herein, the bottom side of the substrate body resides on the perimeter wall to form a cavity, and the signal via structure extends through the perimeter wall and is electrically coupled to the metal trace. The semiconductor die is mounted on the bottom side of the substrate body, exposed to the cavity, and electrically coupled to the metal trace. The thermal vias conduct heat generated from the semiconductor die toward a top side of the substrate body.

23 Claims, 9 Drawing Sheets

(CROSS-SECTIONAL VIDEW B-B')

Figure 5A:
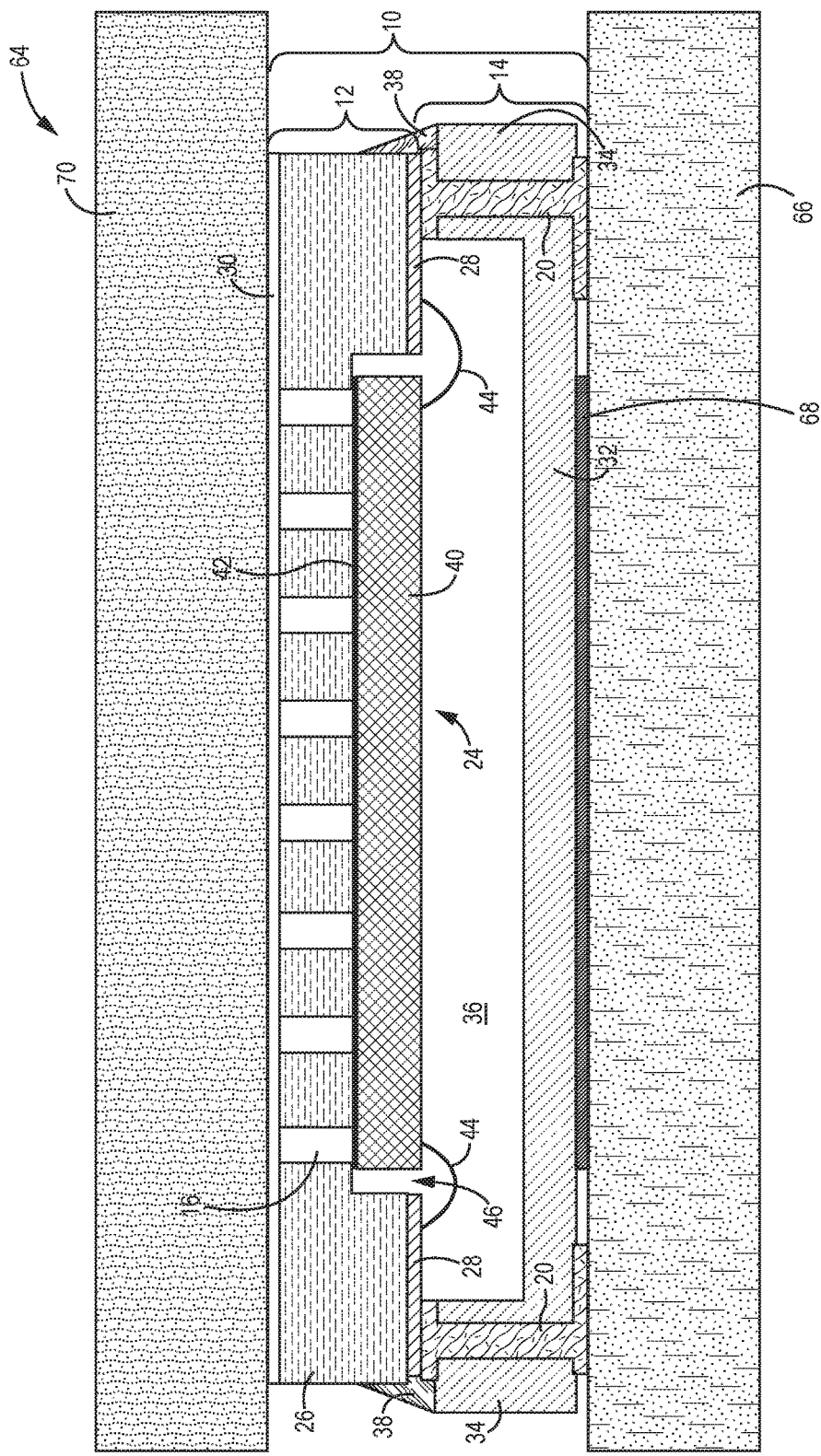

(51) Int. Cl.
*H01L 23/00* (2006.01)
*H01L 23/373* (2006.01)
*H01L 23/498* (2006.01)

(52) U.S. Cl.
CPC .. *H01L 23/49827* (2013.01); *H01L 23/49833* (2013.01); *H01L 23/49838* (2013.01); *H01L 23/66* (2013.01); *H01L 24/32* (2013.01); *H01L 24/48* (2013.01); *H01L 24/73* (2013.01); *H01L 2223/6611* (2013.01); *H01L 2223/6616* (2013.01); *H01L 2224/32225* (2013.01); *H01L 2224/32245* (2013.01); *H01L 2224/48091* (2013.01); *H01L 2224/48106* (2013.01); *H01L 2224/48227* (2013.01); *H01L 2224/73265* (2013.01); *H01L 2924/15153* (2013.01)

(58) Field of Classification Search
CPC ......... H01L 23/49833; H01L 23/49827; H01L 23/49838; H01L 23/66; H01L 24/48; H01L 2223/6616; H01L 2924/15153; H01L 2224/48106; H01L 2224/48227; H01L 2223/6611; H01L 2224/322
See application file for complete search history.

(56) References Cited

U.S. PATENT DOCUMENTS

| | | | | |
|---|---|---|---|---|
| 9,991,181 | B2* | 6/2018 | Meliane | H01L 23/49833 |
| 2010/0244161 | A1* | 9/2010 | Tabrizi | H01L 23/055 257/415 |
| 2011/0089529 | A1* | 4/2011 | Fowlkes | H01L 23/3677 257/528 |
| 2011/0127655 | A1* | 6/2011 | Fujii | H01L 23/04 257/664 |
| 2017/0271221 | A1* | 9/2017 | Bovaird | H01L 23/055 |

OTHER PUBLICATIONS

Author Unknown, "Microcircuits: SD-18 Part Requirement & Application Guide," Naval Sea Systems Command, Warfare Centers, NSWC Crane Division, no date, accessed Aug. 17, 2016, http://www.navsea.navy.mil/Home/Warfare-Centers/NSWC-Crane/Resources/SD-18/Products/Microcircuits/Packaging.aspx, 9 pages.

Chin, Spencer, "Flexible BGA hurdles cost barrier," Electronic Products, Dec. 1, 1997, 4 pages, http://www.electronicproducts.com/Passive_Components/Flexible_BGA_hurdles_cost_barrier.aspx.

Author Unknown, "IC Packaging—Part I," National Museum of American History, Series 9, Integrated Circuit Engineering Collection, ICECAP Reports, Feb. 10, 1982, 11 pages, http://smithsonianchips.si.edu/ice/package.htm.

Schueller, R. D. et al., "Performance and Reliability of a Cavity Down Tape BGA Package," 1997 IEEE/CPMT Electronic Packaging Technology Conference, 1997, IEEE, pp. 151-162.

* cited by examiner

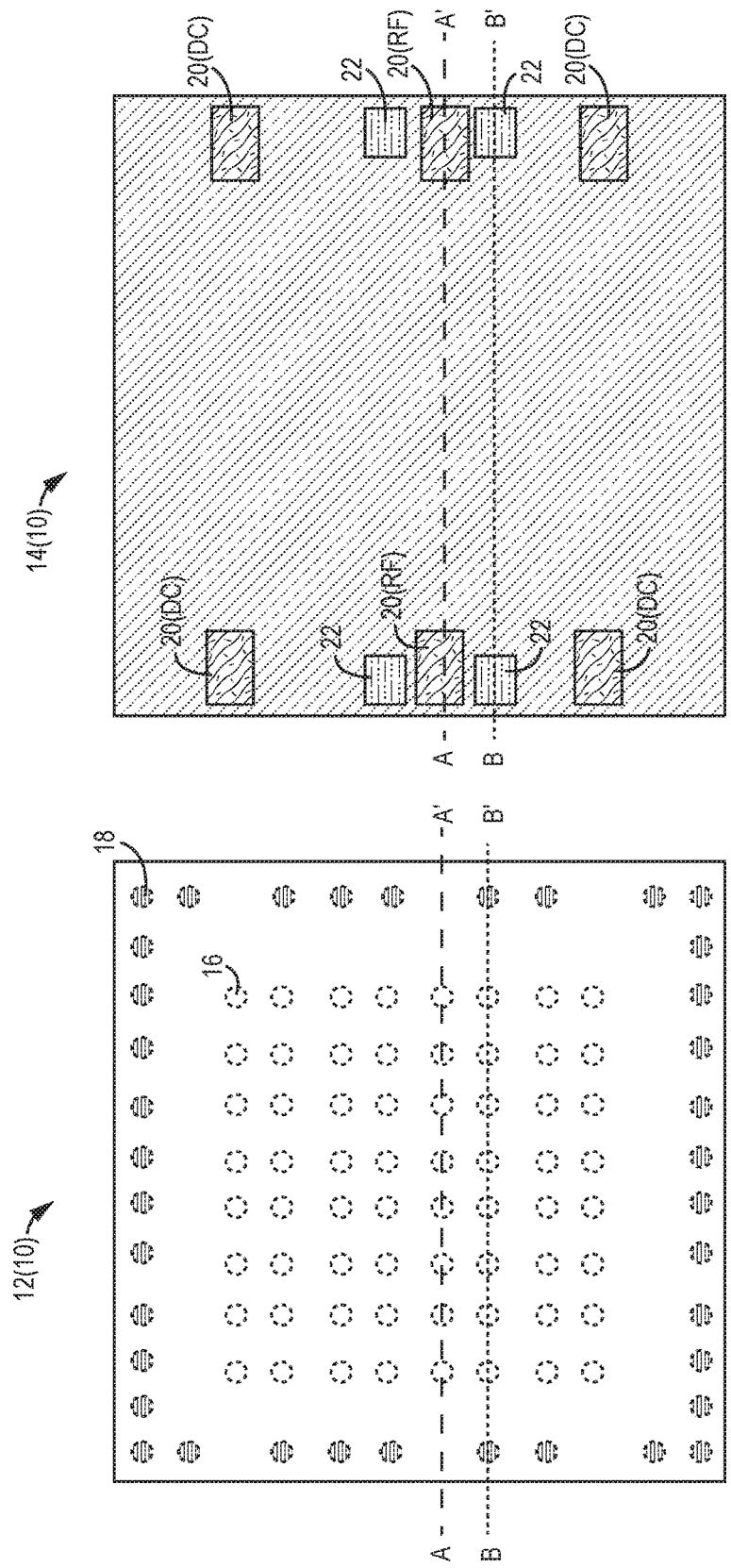

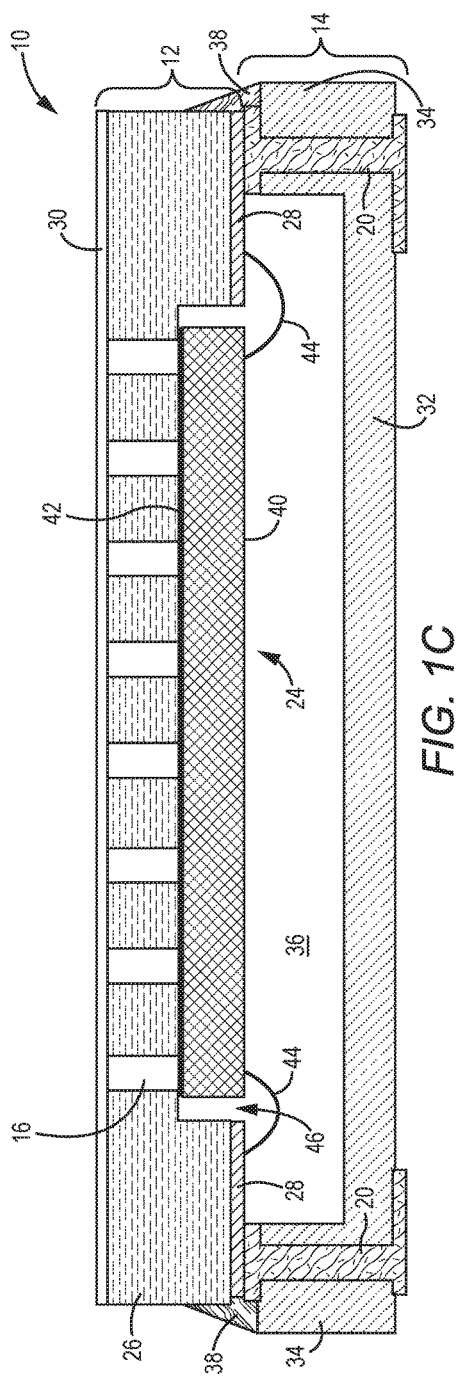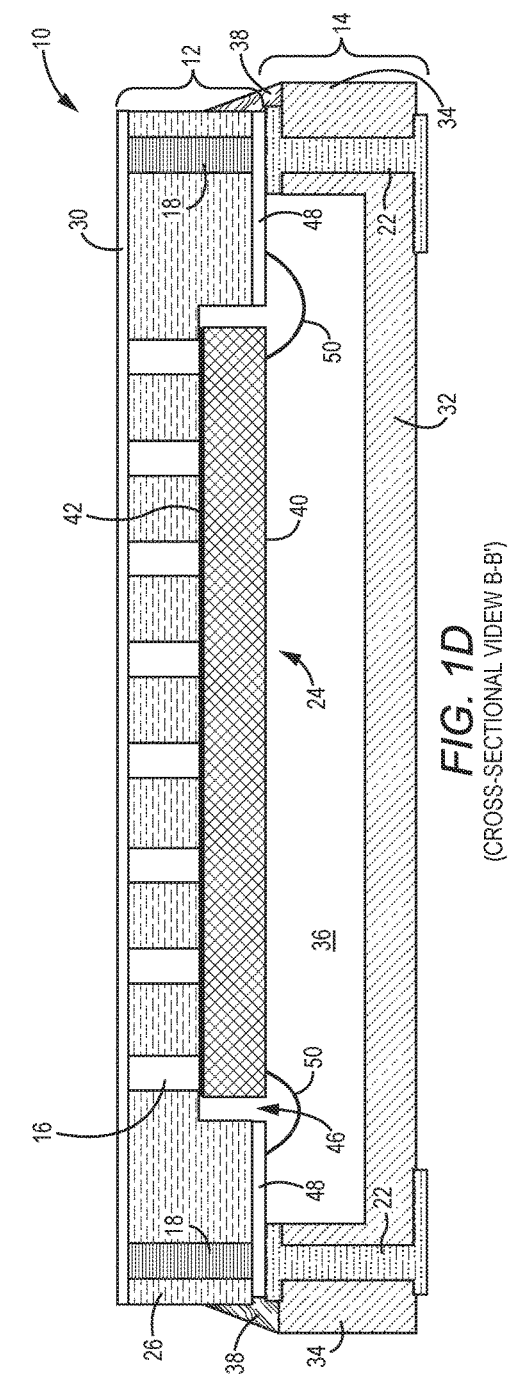

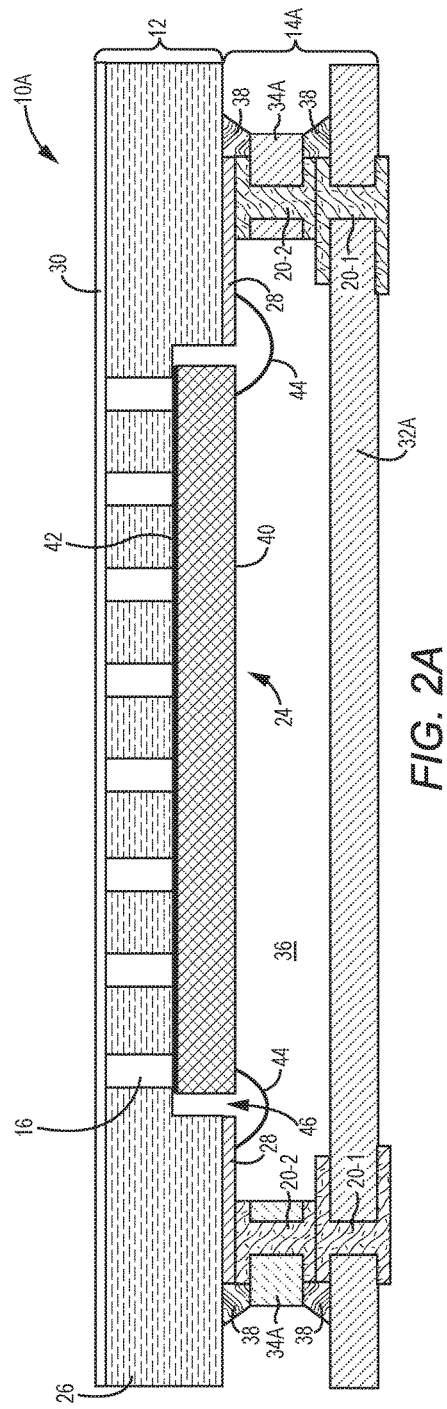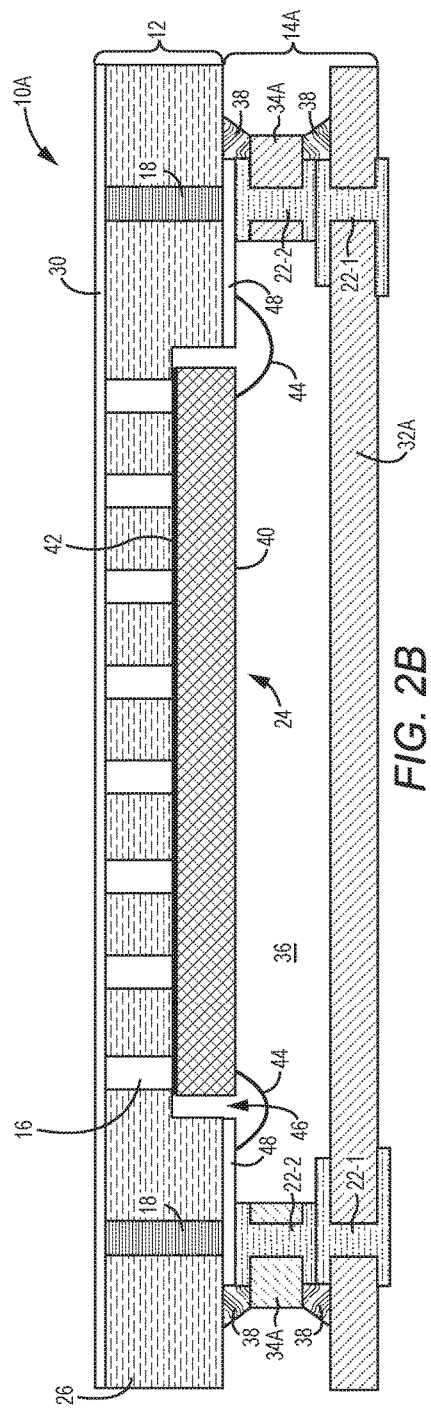

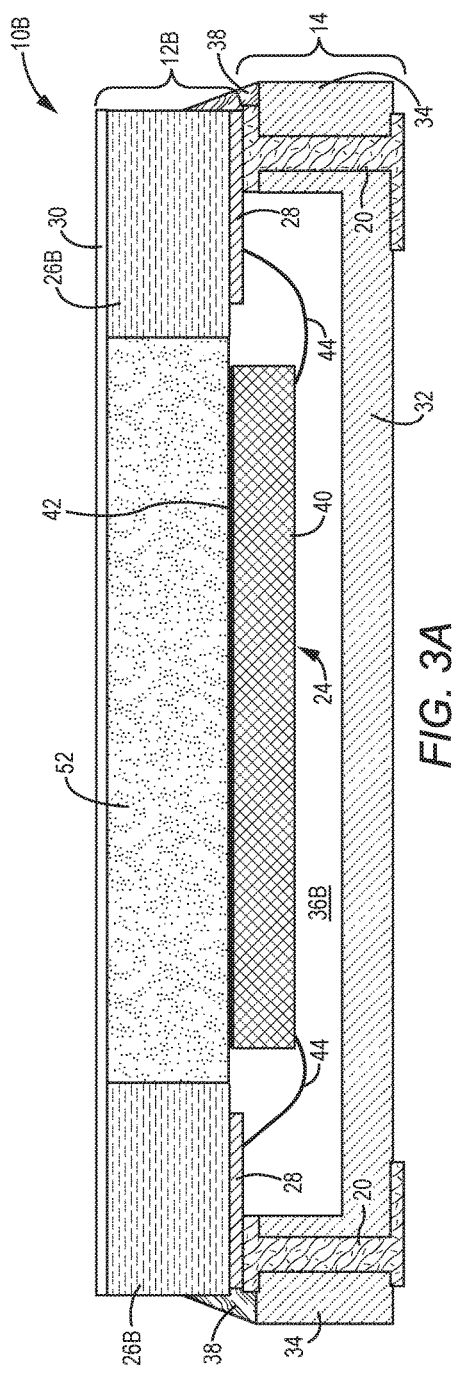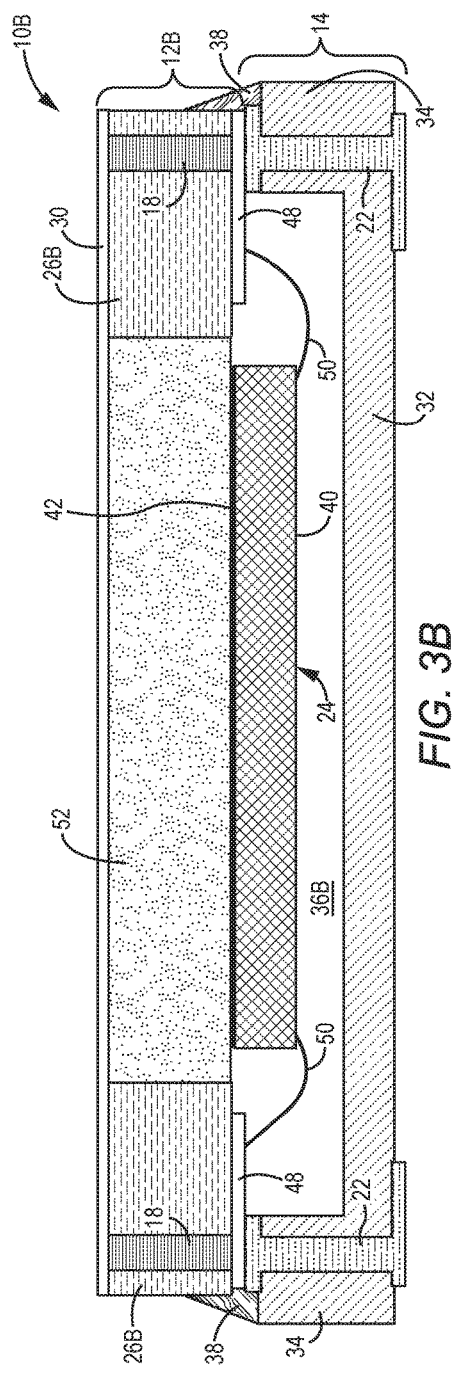

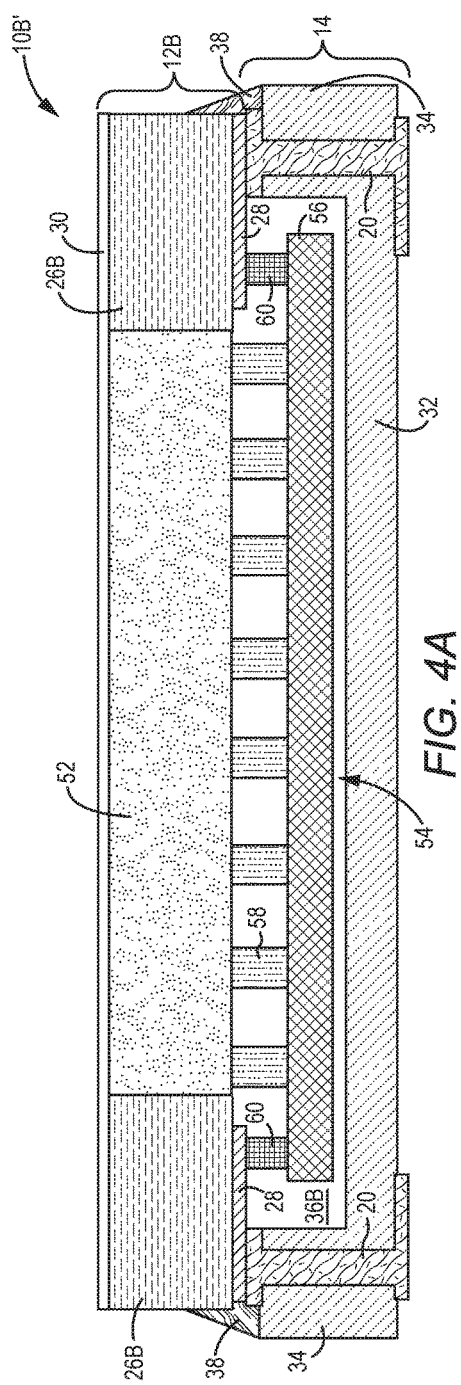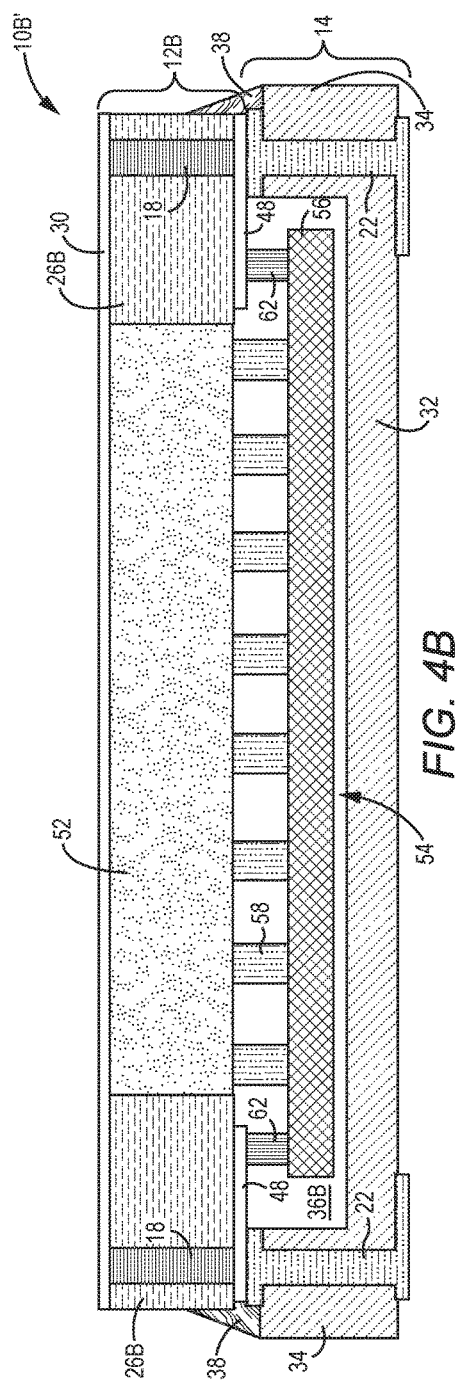
FIG. 4A
FIG. 4B

AIR CAVITY PACKAGE

RELATED APPLICATIONS

This application claims the benefit of provisional patent application Ser. No. 62/379,922, filed Aug. 26, 2016, the disclosure of which is hereby incorporated herein by reference in its entirety.

FIELD OF THE DISCLOSURE

The present disclosure relates to an air-cavity package, and more particularly to an air-cavity package, which is able to separate signal transmission and thermal management into different planes.

BACKGROUND

In semiconductor packaging, mold compounds are normally used to encapsulate flip-chip dies and or wire-bonded dies to protect the dies against damage from the outside environment. However, direct contact of the mold compounds and active die surfaces may adversely impact the electrical performance of the dies, especially for dies supporting high frequency applications. Accordingly, it is desirable to package the dies in a non-mold-contact configuration for enabling a better high frequency performance.

For conventional semiconductor packages, signal transmission (radio frequency signal/direct current signal/grounding signal) and heat exchange share a common plane of the package. In some applications, especially for high frequency applications, the presence of heat exchanging elements close to the signal transmission areas may impact the quality and fidelity of the signal transmission.

Accordingly, there remains a need for improved package designs to separate the signal transmission and heat exchange to enhance the high frequency performance of the semiconductor packages without significantly increasing the package size.

SUMMARY

The present disclosure relates to an air-cavity package, which is able to separate signal transmission and thermal management into different planes. According to one embodiment, an air-cavity package includes a substrate, a base, and at least one semiconductor die. The substrate includes a substrate body having a top side and a bottom side, a first metal trace on the bottom side of the substrate body, and a number of thermal vias that extend from the top side of the substrate body to the bottom side of the substrate body and are separate from the first metal trace. The base includes a base body, a perimeter wall that extends about a perimeter of the base body, and at least one signal via structure. Herein, the bottom side of the substrate body resides on a top surface of the perimeter wall; a cavity is defined by a portion of the bottom side of the substrate body, an inside surface of the perimeter wall, and a portion of a top surface of the base body; and the at least one signal via structure extends from the top surface of the perimeter wall to a bottom surface of the base body and is electrically coupled to the first metal trace. In addition, the at least one semiconductor die is mounted on the bottom side of the substrate body, exposed to the cavity, and electrically coupled to the first metal trace. The number of thermal vias are coupled to the at least one semiconductor die and conduct heat generated from the at least one semiconductor die toward the top side of the substrate body.

In one embodiment of the air-cavity package, the substrate further includes a second metal trace on the bottom side of the substrate body and at least one substrate ground via that extends from the top side of the substrate body to the bottom side of the substrate body. The second metal trace is separate from the first metal trace and electrically coupled to the at least one substrate ground via. The base further includes at least one base ground via structure that extends from the top surface of the perimeter wall to the bottom surface of the base body. The at least one base ground via structure is electrically coupled to the second metal trace and electrically isolated from the at least one signal via structure. Herein, the at least one semiconductor die is also electrically coupled to the second metal trace.

According to another embodiment, the air-cavity package is included in a system assembly. The system assembly also includes a printed circuit board (PCB) coupled to the bottom surface of the base body and a cold plate residing over the substrate metal layer. Herein, the at least one signal via structure and the at least one base ground via structure are electrically coupled to the PCB, and the substrate metal layer is thermally coupled to the cold plate.

According to another embodiment, an air-cavity package includes a substrate, a base, and at least one semiconductor die. The substrate includes a substrate body having a top side and a bottom side, a first metal trace on the bottom side of the substrate body, and an embedded heat slug that extends from the top side of the substrate body to the bottom side of the substrate body and is separate from the first metal trace. The base includes a base body, a perimeter wall that extends about a perimeter of the base body, and at least one signal via structure. Herein, the bottom side of the substrate body resides on a top surface of the perimeter wall; a cavity is defined by a portion of the bottom side of the substrate body, an inside surface of the perimeter wall, and a portion of a top surface of the base body; and the at least one signal via structure extends from the top surface of the perimeter wall to a bottom surface of the base body and is electrically coupled to the first metal trace. In addition, the at least one semiconductor die is mounted on the bottom side of the substrate body, exposed to the cavity, and electrically coupled to the first metal trace. The heat slug is coupled to the at least one semiconductor die and conducts heat generated from the at least one semiconductor die toward the top side of the substrate body.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure FIGS. 1A-1D provide an exemplary air-cavity package according to one embodiment of the present disclosure.

FIGS. 2A-2B provide a first alternative air-cavity package according to one embodiment of the present disclosure.

FIGS. 3A-3B provide a second alternative air-cavity package according to one embodiment of the present disclosure.

FIGS. 4A-4B provide an exemplary air-cavity package with a flip-chip die according to one embodiment of the present disclosure.

Figure 5B:
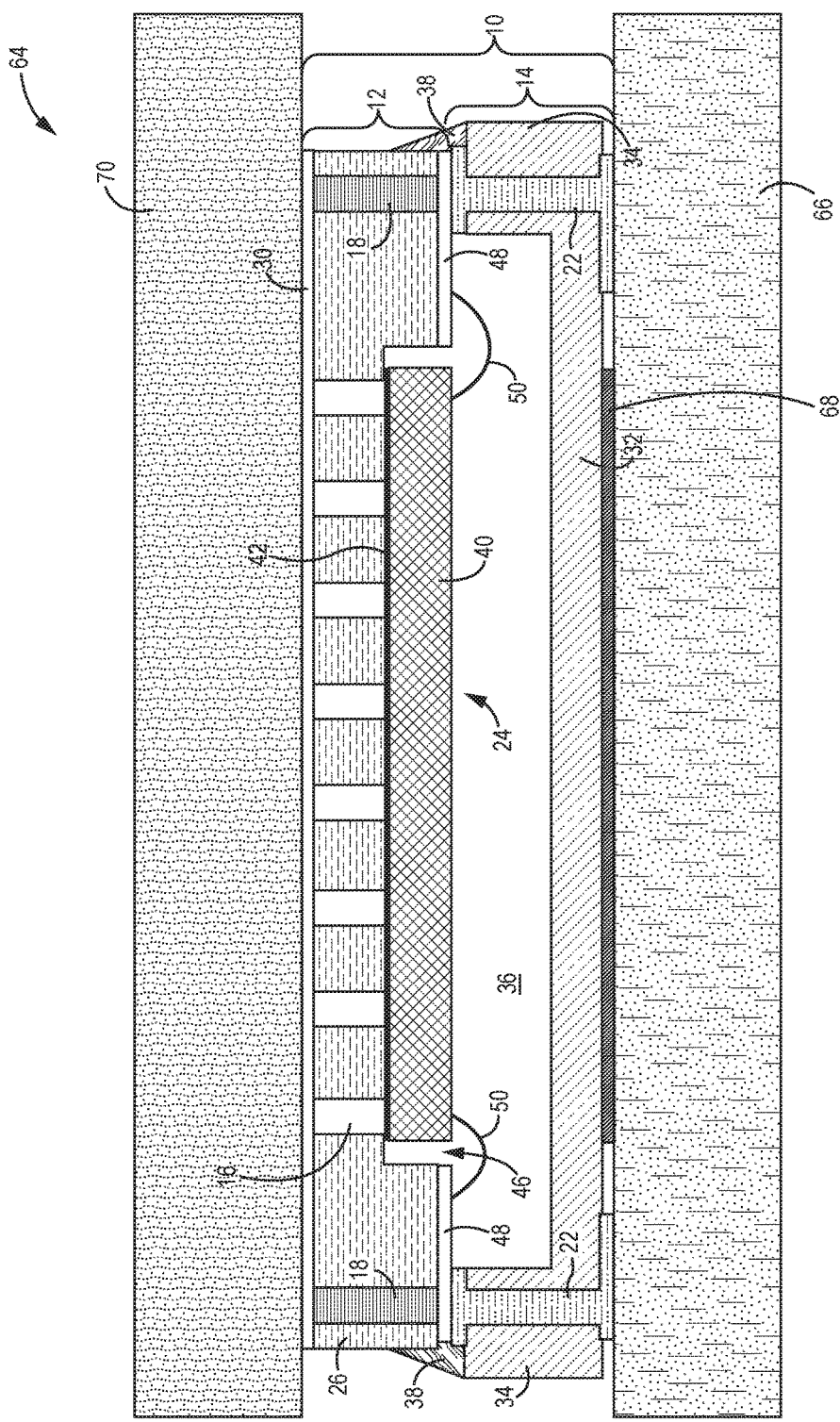

FIGS. 5A-5B provide an exemplary system assembly including the air-cavity package shown in FIG. 1C and FIG. 1D, respectively.

Figure 6A:
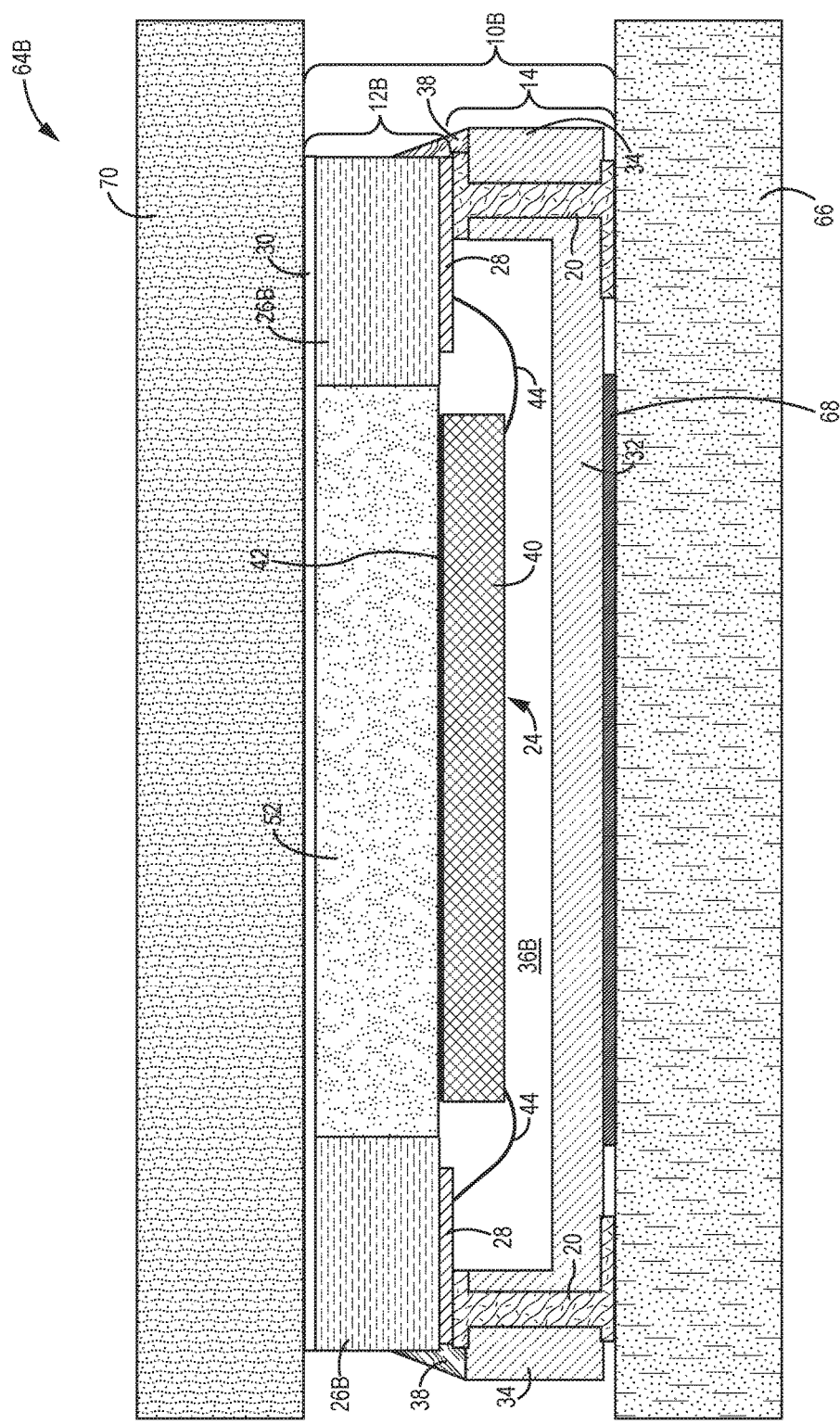
Figure 6B:
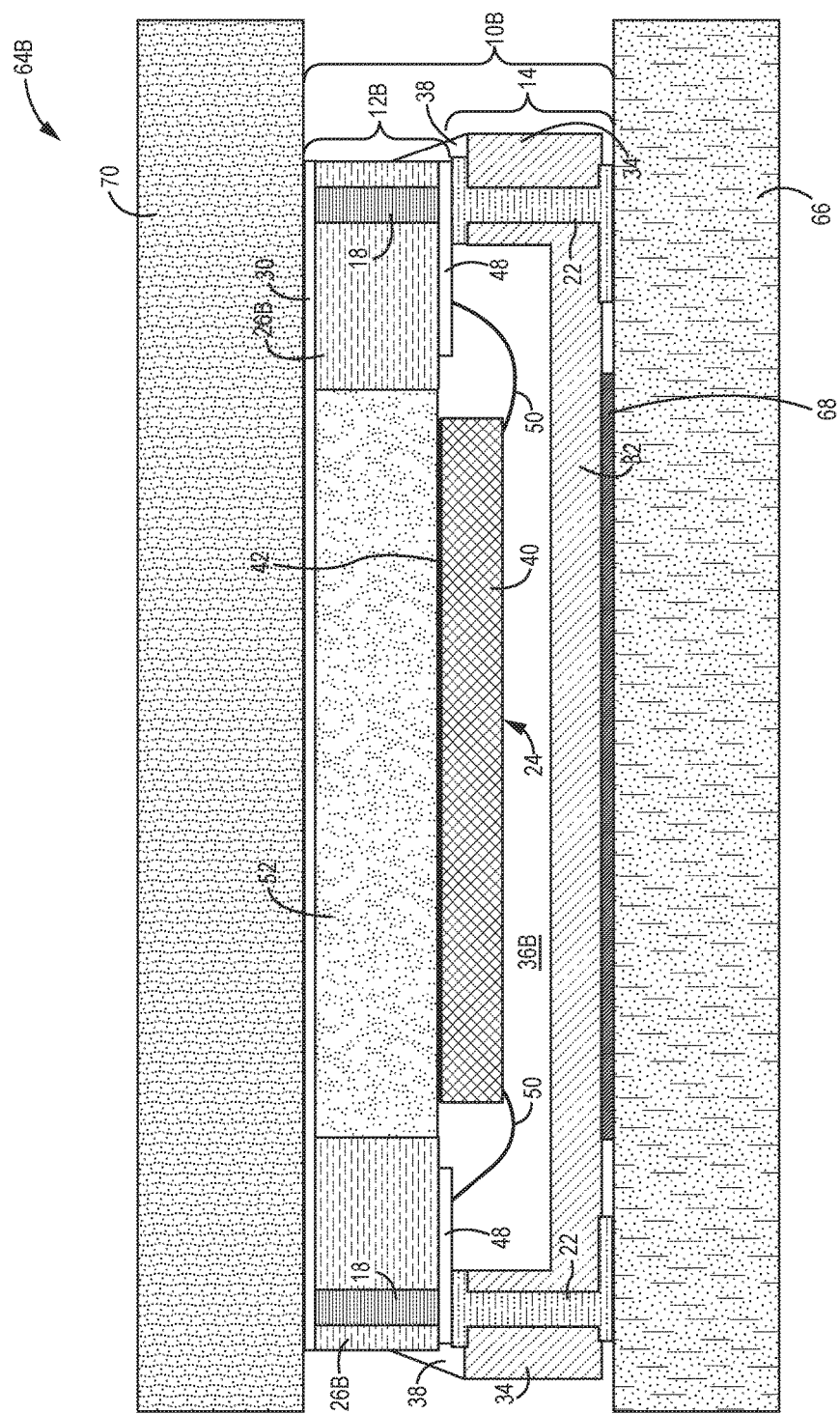

FIGS. 6A-6B provide an exemplary system assembly including the air-cavity package shown in FIG. 3A and FIG. 3B, respectively.

It will be understood that for clear illustrations, FIGS. 1A-6B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIGS. 1A-1B show a top view and a bottom view of an exemplary air-cavity package 10, respectively, according to one embodiment of the present disclosure. The air-cavity package 10 includes a substrate 12 and a base 14, which resides under the substrate 12. The substrate 12 includes a number of thermal vias 16 and a number of substrate ground vias 18 about a perimeter of the substrate 12 (only one of the thermal vias and one of the substrate ground vias are labeled with reference numbers for clarity). For the purpose of this illustration, the base 14 includes six signal via structures 20 and four base ground via structures 22, which are electrically isolated from the signal via structures 20. In different applications, the base 14 may include fewer or more signal via structures 20/base ground via structures 22, and the layout of the signal via structures 20/base ground via structures 22 may be different. Herein, the signal via structures 20 may be used for radio frequency (RF) signal transmission or direct current (DC) signal transmission. The signal via structures 20 (RF) used for RF signal transmission are electrically isolated from the signal via structures 20 (DC) used for DC signal transmission.

FIG. 1C provides a cross-sectional view of the air-cavity package 10 at the dashed-line (A-A') in FIGS. 1A-1B. Besides the substrate 12 and the base 14, the air-cavity package 10 also includes a wire-bonding die 24. In different applications, the air-cavity package 10 may include multiple wire-bonding dies 24. Herein, the substrate 12 includes a substrate body 26 having a top side and a bottom side, first metal traces 28 on the bottom side of the substrate body 26, a substrate metal layer 30 over at least a portion of the top side of the substrate body 26, and the thermal vias 16 (only one of the thermal vias is labeled with reference numbers for clarity) that extend from the top side of the substrate body 26 to the bottom side of the substrate body 26. Each of the thermal vias 16 is thermally coupled to the substrate metal layer 30 and separate from the first metal traces 28. In some applications, the substrate metal layer 30 may be a continuous plate or sheet over all of the thermal vias 16.

The base 14 includes a base body 32, a perimeter wall 34 that extends about a perimeter of the base body 32, and the signal via structures 20. Herein, the bottom side of the substrate body 26 resides on a top surface of the perimeter wall 34, and a cavity 36 is defined by a portion of the bottom side of the substrate body 26, an inside surface of the perimeter wall 34, and a portion of a top surface of the base body 32. Each of the signal via structures 20 extends from a top surface of the perimeter wall 34 to a bottom surface of the base body 32 and is electrically coupled to a corresponding first metal trace 28 on the bottom side of the substrate body 26. In some applications, a package-attach material (not shown) may be applied between each of the signal via structures 20 and the corresponding first metal trace 28. Herein, the cavity 36 may be sealed off by a sealing material 38. The sealing material 38 extends about a majority of, if not the entirety of, an exterior portion of a junction, which is formed between the top surface of the perimeter wall 34 and the bottom side of the substrate body 26.

The wire-bonding die 24 includes a wire-bonding die body 40 mounted on the bottom side of the substrate body 26 via a die attach material 42, and first bonding wires 44 extending from a bottom surface of the wire-bonding die body 40 and electrically coupled to the first metal traces 28. The bottom surface of the wire-bonding die body 40 and the first bonding wires 44 are exposed to the cavity 36. In this embodiment, the bottom side of the substrate body 26 may not have a flat surface and may have a recess 46, in which the wire-bonding die 24 is mounted. The thermal vias 16 extend from the top surface of the substrate body 26 to the recess 46 and are coupled to a top surface of the wire-bonding die body 40 via the die attach material 42. Herein, the top surface of the wire-bonding die body 40 has no active circuits. The thermal vias 16 conduct heat generated from the wire-bonding die 24 toward the top side of the substrate body 26.

FIG. 1D provides a cross-sectional view of the air-cavity package 10 at the dashed-line (B-B') in FIGS. 1A-1B. As illustrated in FIG. 1D, the substrate 12 further includes the substrate ground vias 18 about a perimeter of the substrate 12 and second metal traces 48 on the bottom side of the substrate body 26. Each of the substrate ground vias 18 extends from the top side of the substrate body 26 to the bottom side of the substrate body 26 and is electrically coupled to a corresponding second metal trace 48. Note that the second metal traces 48 shown in FIG. 1D are separate from the first metal traces 28 shown in FIG. 1C. Further, the substrate metal layer 30 may also be thermally coupled to the substrate ground vias 18. If the substrate metal layer 30 is a continuous plate or sheet, the substrate metal layer 30 may be over all of the thermal vias 16 and the substrate ground vias 18.

The base 14 also includes the base ground via structures 22 that extend from the top surface of the perimeter wall 34 to the bottom surface of the base body 32. Each of the base ground via structures 22 is electrically coupled to a corresponding second metal trace 48 on the bottom side of the substrate body 26 and electrically isolated from the signal via structures 20. In some applications, a package-attach material (not shown) may be applied between each of the base ground via structures 22 and the corresponding second metal trace 48. In addition, the wire-bonding die 24 is electrically coupled to the second metal traces 48 by second bonding wires 50, which extend from the bottom surface of the wire-bonding die body 40.

FIGS. 2A-2B illustrate an alternative air-cavity package 10A according to one embodiment of the present disclosure. The air-cavity package 10A includes the substrate 12, a base 14A, and the wire-bonding die 24. Different from the base 14 in the air-cavity package 10, the base 14A is formed from an individual base body 32A and an individual perimeter wall 34A. The base body 32A includes first signal via structures 20-1 and first base ground via structures 22-1, both of which extend from a top surface of the base body 32A to a bottom surface of the base body 32A. The perimeter wall 34A includes second signal via structures 20-2 and second base ground via structures 22-2, both of which extend from a top surface of the perimeter wall 34A to a bottom surface of the perimeter wall 34A. Herein, the perimeter wall 34A resides between the bottom side of the substrate body 26 and the top surface of the base body 32A, such that each the second signal via structures 20-2 extending through the perimeter wall 34A is electrically coupled to a corresponding first metal trace 28 on the bottom side of the substrate body 26 and a corresponding first signal via structure 20-1 of the base body 32A. Similarly, each of the second base ground via structures 22-2 extending through the perimeter wall 34A is electrically coupled to a corresponding second metal trace 48 on the bottom side of the substrate body 26 and a corresponding first base ground via structure 22-1 of the base body 32A.

In this embodiment, the substrate body 26 and the base body 32A may extend beyond the perimeter wall 34A. The sealing material 38 may be applied about an exterior portion of a first junction, which is formed between the top surface of the perimeter wall 34A and the bottom side of the substrate body 26, and about an exterior portion of a second junction, which is formed between the bottom surface of the perimeter wall 34A and the top surface of the base body 32A.

FIGS. 3A-3B illustrate another alternative air-cavity package 10B according to one embodiment of the present disclosure. The air-cavity package 10B includes a substrate 12B, the base 14, and the wire-bonding die 24. Different from the substrate 12 in the air-cavity package 10, the substrate 12B utilizes a heat slug 52 instead of the thermal vias 16 to conduct heat generated from the wire-bonding die 24. The substrate 12B includes a substrate body 26B having a top side and a bottom side, the first metal traces 28 on the bottom side of the substrate body 26B, the substrate metal layer 30 over at least a portion of the top side of the substrate body 26B, and the heat slug 52. The heat slug 52, which may be formed from copper, copper tungsten, alumina, aluminum-nitride, or the like, is embedded in the substrate body 26B extending from the top side of the substrate body 26B to the bottom side of the substrate body 26B. The heat slug 52 is thermally coupled to the substrate metal layer 30 and is separate from the first metal traces 28.

As illustrated in FIG. 3A, the base 14 includes the base body 32, the perimeter wall 34 that extends about the perimeter of the base body 32, and the signal via structures 20. Herein, the bottom side of the substrate body 26B resides on the top surface of the perimeter wall 34, and a cavity 36B is defined by a portion of the bottom side of the substrate body 26B, the inside surface of the perimeter wall 34, and a portion of the top surface of the base body 32. Each of the signal via structures 20 extends from the top surface of the perimeter wall 34 to the bottom surface of the base body 32 and is electrically coupled to a corresponding first metal trace 28 on the bottom side of the substrate body 26B. In some applications, the sealing material 38 may be used to seal off the cavity 36B. The sealing material 38 may extend about an exterior portion of a junction, which is formed between the top surface of the perimeter wall 34 and the bottom side of the substrate body 26B.

In this embodiment, the wire-bonding die 24 is mounted on a bottom surface of the heat slug 52 via the die attach material 42, exposed to the cavity 36B, and electrically coupled to the first metal traces 28 by the first bonding wires 44. Herein, the substrate 12B does not have a recess, and the bottom side of the substrate body 26B is coplanar with the bottom surface of the heat slug 52. In some applications, the wire-bonding die 24 may be confined within the heat slug 52.

As illustrated in FIG. 3B, the substrate 12B also includes the substrate ground vias 18 that extend from the top side of the substrate body 26B to the bottom side of the substrate body 26B and the second metal traces 48 on the bottom side of the substrate body 26B. Each of the second metal traces 48 is electrically coupled to a corresponding substrate ground via 18 and separate from the first metal traces 28. The substrate metal layer 30 may also be thermally coupled to the substrate ground vias 18. If the substrate metal layer 30 is a continuous plate or sheet, the substrate metal layer 30 may be over the top surface of the heat slug 52 and the substrate ground vias 18.

In addition, the base 14 also includes the base ground via structures 22 that extend from the top surface of the perimeter wall 34 to the bottom surface of the base body 32. Each of the base ground via structures 22 is electrically coupled to a corresponding second metal trace 48 on the bottom side of the substrate body 26B and electrically isolated from the signal via structures 20. The wire-bonding die 24 is electrically coupled to the second metal traces 48 by the second bonding wires 50.

It will be clear to those skilled in the art that it is also possible that a flip-chip die, instead of a wire-bonding die, is mounted on the bottom surface of the heat slug 52. FIGS. 4A-4B provide an exemplary air-cavity package 10B' with a flip-chip die 54 that is mounted on the bottom surface of the heat slug 52 and exposed to the cavity 36B. The flip chip die 54 includes a flip-chip die body 56, thermal interconnects 58 (only one of the thermal interconnects is labeled with reference number for clarity), first interconnects 60, and second interconnects 62. Each of the thermal interconnects 58 extends from a top surface of the flip-chip die body 56 and are thermally coupled to the heat slug 52. The heat slug 52 conducts heat generated from the flip-chip die 54 toward the top side of the substrate body 26B. Each of the first interconnects 60 extends from the top surface of the flip-chip die body 56 and is electrically coupled to a corresponding first metal trace 28, and each of the second interconnects 62 extends from the top surface of the flip-chip die body 56 and is electrically coupled to a corresponding second metal trace 48. The first interconnects 60 are electrically isolated from the second interconnects 62.

FIGS. 5A and 5B provide an exemplary system assembly 64 including the air-cavity package 10 shown in FIG. 1C and FIG. D, respectively. Besides the air-cavity package 10, the system assembly 64 also includes a printed circuit board (PCB) 66 coupled to the bottom surface of the base body 32 via a package attach material 68 and a cold plate 70 residing over the substrate metal layer 30. The signal via structures 20 and the base ground via structures 22 are electrically coupled to the PCB 66, and the substrate metal layer 30 is thermally coupled to the cold plate 70. Accordingly, RF signals and DC signals will be transmitted from the wire-bonding die 24 to the PCB 66 through the first metal traces 28 and the signal via structures 20, and ground signals will be transmitted from the wire-bonding die 24 to the PCB 66 through the second metal traces 48 and the base ground via structures 22. In addition, the heat generated from the wire-bonding die 24 is conducted to the cold plate 70 through the thermal vias 16 and the substrate metal layer 30.

FIGS. 6A and 6B provide an exemplary system assembly 64B including the air-cavity package 10B shown in FIG. 3A and FIG. 3B, respectively. Similar to the system assembly 64, the system assembly 64B includes the air-cavity package 10B, the PCB 66 and the cold plate 70. RF signals and DC signals are transmitted from the wire-bonding die 24 to the PCB 66 through the first metal traces 28 and the signal via structures 20, and ground signals are transmitted from the wire-bonding die 24 to the PCB 66 through the second metal traces 48 and the base ground via structures 22. In addition, the heat generated from the wire-bonding die 24 is conducted to the cold plate 70 through the heat slug 52 and the substrate metal layer 30.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a substrate comprising a substrate body having a top side and a bottom side, a first metal trace on the bottom side of the substrate body, a second metal trace on the bottom side of the substrate body, at least one substrate ground via that extends from the top side of the substrate body to the bottom side of the substrate body, and a plurality of thermal vias that extends from the top side of the substrate body to the bottom side of the substrate body, wherein:
      the second metal trace is separate from the first metal trace; and
      the plurality of thermal vias is separate from the first metal trace;
   a base comprising a base body, a perimeter wall that extends about a perimeter of the base body, at least one base ground via structure, and at least one signal via structure, wherein:
      the bottom side of the substrate body resides on a top surface of the perimeter wall;
      a cavity is defined by a portion of the bottom side of the substrate body, an inside surface of the perimeter wall, and a portion of a top surface of the base body;
      the at least one signal via structure extends from the top surface of the perimeter wall to a bottom surface of the base body and is electrically coupled to the first metal trace; and
      the at least one base ground structure extends from the top surface of the perimeter wall to the bottom surface of the base body, wherein the at least one base ground via structure and the at least one substrate ground via are electrically coupled to the second metal trace, and electrically isolated from the first metal trace and the at least one signal via structure; and
   at least one semiconductor die mounted on the bottom side of the substrate body, exposed to the cavity, and electrically coupled to the first metal trace and the second metal trace, wherein the plurality of thermal vias is coupled to the at least one semiconductor die and conducts heat generated from the at least one semiconductor die toward the top side of the substrate body.

2. The apparatus of claim 1 further comprising a printed circuit board (PCB) coupled to the bottom surface of the base body, wherein the at least one signal via structure and the at least one base ground via structure are electrically coupled to the PCB.

3. The apparatus of claim 1 wherein the substrate further comprises a substrate metal layer over at least a portion of the top side of the substrate body and thermally coupled to the plurality of thermal vias and the at least one substrate ground via.

4. The apparatus of claim 3 wherein the substrate metal layer is a continuous plate or sheet over all of the plurality of thermal vias and the at least one substrate ground via.

5. The apparatus of claim 3 further comprising a cold plate that resides over and is thermally coupled to the substrate metal layer.

6. The apparatus of claim 1 wherein the at least one semiconductor die is electrically coupled to the first metal trace by a bonding wire.

7. The apparatus of claim 1 wherein the bottom side of the substrate body has a recess in which the at least one semiconductor die is mounted and the plurality of thermal vias extends from the top surface of the substrate body to the recess.

8. The apparatus of claim 1 further comprising a junction formed between the top surface of the perimeter wall and the bottom side of the substrate body and a sealing material that extends about an exterior portion of the junction to seal off the cavity.

9. The apparatus of claim 1 wherein the substrate further comprises a substrate metal layer over at least a portion of the top side of the substrate body and thermally coupled to the plurality of thermal vias.

10. The apparatus of claim 9 wherein the substrate metal layer is a continuous plate or sheet over all of the plurality of thermal vias.

11. The apparatus of claim 1 wherein the at least one signal via structure comprises a first signal via structure and a second signal via structure, which is electrically isolated from the first signal via structure.

12. An apparatus comprising:
a substrate comprising a substrate body having a top side and a bottom side, a first metal trace on the bottom side of the substrate body, a second metal trace on the bottom side of the substrate body, at least one substrate ground via that extends from the top side of the substrate body to the bottom side of the substrate body, and a heat slug that extends from the top side of the substrate body to the bottom side of the substrate body, wherein:
the second metal trace is separate from the first metal trace; and
the heat slug is separate from the first metal trace;
a base comprising a base body, a perimeter wall that extends about a perimeter of the base body, at least one base ground via structure, and at least one signal via structure, wherein:
the bottom side of the substrate body resides on a top surface of the perimeter wall;
a cavity is defined by a portion of the bottom side of the substrate body, an inside surface of the perimeter wall, and a portion of a top surface of the base body;
the at least one signal via structure extends from the top surface of the perimeter wall to a bottom surface of the base body and is electrically coupled to the first metal trace; and
the at least one base ground structure extends from the top surface of the perimeter wall to the bottom surface of the base body, wherein the at least one base ground via structure and the at least one substrate ground via are electrically coupled to the second metal trace, and electrically isolated from the first metal trace and the at least one signal via structure; and
at least one semiconductor die mounted on a bottom surface of the heat slug, exposed to the cavity, and electrically coupled to the first metal trace and the second metal trace, wherein the heat slug is coupled to the at least one semiconductor die and conducts heat generated from the at least one semiconductor die toward the top side of the substrate body.

13. The apparatus of claim 12 wherein the heat slug is formed from one of a group consisting of copper, copper tungsten, alumina, and aluminum-nitride.

14. The apparatus of claim 12 wherein the at least one semiconductor die is confined within the heat slug.

15. The apparatus of claim 12 further comprising a PCB coupled to the bottom surface of the base body, wherein the at least one signal via structure and the at least one base ground via structure are electrically coupled to the PCB.

16. The apparatus of claim 12 further comprising a substrate metal layer over at least a portion of the top side of the substrate body and thermally coupled to the heat slug and the at least one substrate ground via.

17. The apparatus of claim 16 further comprising a cold plate that resides over and is thermally coupled to the substrate metal layer.

18. The apparatus of claim 12 wherein the at least one semiconductor die is electrically coupled to the first metal trace by a bonding wire.

19. The apparatus of claim 12 wherein the at least one semiconductor die comprises a flip-chip die, which has a plurality of thermal interconnects and at least one signal interconnect, wherein the at least one semiconductor die is electrically coupled to the first metal trace by the at least one signal interconnect, and thermally coupled to the heat slug by the plurality of thermal interconnects.

20. The apparatus of claim 12 further comprising a junction formed between the top surface of the perimeter wall and the bottom side of the substrate body and a sealing material that extends about an exterior portion of the junction to seal off the cavity.

21. The apparatus of claim 12 wherein the at least one signal via structure comprises a first signal via structure and a second signal via structure, which is electrically isolated from the first signal via structure.

22. An apparatus comprising:
a substrate comprising a substrate body having a top side and a bottom side, a first metal trace on the bottom side of the substrate body, a second metal trace on the bottom side of the substrate body, at least one substrate ground via that extends from the top side of the substrate body to the bottom side of the substrate body, and a plurality of thermal vias that extends from the top side of the substrate body to the bottom side of the substrate body, wherein:
the second metal trace is separate from the first metal trace; and
the plurality of thermal vias is separate from the first metal trace;
a base body comprising at least one first base ground via structure and at least one first signal via structure, wherein:
the at least one first signal via structure extends from a top surface of the base body to a bottom surface of the base body; and
the at least one first base ground via structure extends from the top surface of the base body to the bottom surface of the base body, and is electrically isolated from the at least one first signal via structure;
a perimeter wall residing between the bottom side of the substrate body and the top surface of the base body, and comprising at least one second base ground via structure and at least one second signal via structure, wherein:

a cavity is defined by a portion of the bottom side of the substrate body, an inside surface of the perimeter wall, and a portion of the top surface of the base body;

the at least one second signal via structure extends from a top surface of the perimeter wall to a bottom surface of the perimeter wall, and is electrically coupled to the first metal trace and the at least one first signal via structure; and the at least one second base ground via structure extends from the top surface of the perimeter wall to the bottom surface of the perimeter wall, wherein:

the at least one first base ground via structure, the at least one second base ground via structure, the second metal trace, and the at least one substrate ground via are electrically coupled; and the at least one second base ground via structure is electrically isolated from the first metal trace, the at least one first signal via structure, and the at least one second signal via structure; and at least one semiconductor die mounted on the bottom side of the substrate body, exposed to the cavity, and electrically coupled to the first metal trace and the second metal trace, wherein the plurality of thermal vias is coupled to the at least one semiconductor die and conducts heat generated from the at least one semiconductor die toward the top side of the substrate body.

23. The apparatus of claim 22 wherein the substrate body and the base body extend beyond the perimeter wall.

* * * * *